(12) United States Patent
Igarashi (10) Patent No.: US 6,838,777 B2
(45) Date of Patent: Jan. 4, 2005

(54) SEMICONDUCTOR DEVICE AND METHOD OF MANUFACTURING THE SAME

(75) Inventor: Motoshige Igarashi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/648,223

(22) Filed: Aug. 27, 2003

(65) Prior Publication Data

US 2004/0207098 A1 Oct. 21, 2004

(30) Foreign Application Priority Data

Apr. 17, 2003 (JP) ........................................ 2003-112568

(51) Int. Cl.$^7$ ............................................ H01L 27/088
(52) U.S. Cl. ........................ 257/900; 257/339; 257/344; 257/346; 257/408; 438/230; 438/301; 438/303; 438/289
(58) Field of Search ........................................ 257/900

(56) References Cited

U.S. PATENT DOCUMENTS

| | | | | |
|---|---|---|---|---|
| 5,863,824 A | * | 1/1999 | Gardner et al. | 438/303 |
| 5,877,530 A | * | 3/1999 | Aronowitz et al. | 257/344 |
| 6,433,871 B1 | * | 8/2002 | Lensing et al. | 356/450 |
| 6,703,648 B1 | * | 3/2004 | Xiang et al. | 257/192 |
| 2001/0009792 A1 | * | 7/2001 | Bothra et al. | 438/302 |

FOREIGN PATENT DOCUMENTS

| | | |
|---|---|---|
| JP | 8-204184 | 8/1996 |
| JP | 2002-289841 | 10/2002 |

* cited by examiner

*Primary Examiner*—David Nelms
*Assistant Examiner*—Andy Huynh
(74) *Attorney, Agent, or Firm*—Oblon, Spivak, McClelland, Maier & Neustadt, P.C.

(57) ABSTRACT

Gate electrodes (3) are formed on a semiconductor substrate (1), each with a gate insulating film (2) interposed therebetween. A pair of offset spacers (4) are respectively formed on opposite side faces of each of the gate insulating film (2) and the gate electrodes (3). Diffusion layers (5) are formed in the semiconductor substrate (1) on opposite sides of a portion of the semiconductor substrate (1) immediately under each of the gate electrodes (3), by ion implantation. While the gate electrodes (3) have various configurations such as a gate electrode having a rectangular section, an upwardly tapered gate electrode and a downwardly tapered gate electrode, respective configurations of the offset spacers (4) are adjusted so that lengths each obtained by adding the gate length of the gate electrode (3), which gate length extends on an interface between the gate insulating film (2) and the gate electrode (3), to a width of the pair of the offset spacers (4), which width extends on an interface between the offset spacers (4) and the semiconductor substrate (1), are substantially uniform.

2 Claims, 7 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing a semiconductor device, and more particularly to a semiconductor device which provides for suppression of variation in characteristics among transistors by utilizing an offset spacer and a method of manufacturing such a semiconductor device.

2. Description of the Background Art

In a semiconductor device, characteristics of a transistor depends on a configuration of a gate electrode. For this reason, variation in configuration among gate electrodes due to variation in density of gate electrodes in a gate electrode pattern within a wafer surface affects characteristics of transistors, resulting in variation in characteristics among the transistors. To overcome this drawback, Japanese Patent Application Laid-Open No. 8-204184 (pp. 3–4 and FIGS. 1 to 3, hereinafter referred to as "JP 8-204184") has proposed a semiconductor device which is capable of obtaining uniform characteristics of transistors in a wafer surface in spite of variation in density of gate electrodes in a gate electrode pattern, as well as a method of manufacturing such a semiconductor device.

According to JP 8-204184, first, downwardly tapered gate electrodes are formed on a semiconductor substrate, each with a gate insulating film interposed therebetween. Impurities for forming lightly-doped diffusion layers are implanted into the semiconductor substrate using the gate electrodes as a mask. A sidewall is formed on a side face of each of the gate electrodes. Implants for forming another diffusion layers are implanted into the semiconductor substrate using the gate electrodes and the sidewalls collectively as a mask, to form sources/drains including the lightly-doped diffusion layers and the subsequently-formed diffusion layers, thereby to complete a semiconductor device. In this manner, it is possible to form the sidewalls uniform in width extending along a gate length on a bottom surface thereof.

As an alternative, a semiconductor device utilizing an offset spacer is shown in Japanese Patent Application Laid-Open No. 2002-289841 (pp. 6–8 and FIGS. 1 to 3, hereinafter referred to as "JP 2002-289841"). According to JP 2002-289841, a film of silicon oxide is formed on a semiconductor substrate, and a polysilicon film is formed thereon. Nitrogen is introduced into the polysilicon film in such a manner that an upper portion of the polysilicon film is doped more heavily than a lower portion. Thereafter, the polysilicon film is patterned to form gate electrodes. Another film of silicon oxide is formed so as to cover the gate electrodes, and then is locally removed, to form an offset spacer on a side face of each of the gate electrodes. The offset spacer is formed such that an upper portion thereof has a width smaller than a lower portion. Then, extension regions are formed in the semiconductor substrate, and a silicide film is formed in an upper portion of each of the gate electrodes.

JP 8-204184 is limited to a semiconductor device with a downwardly tapered gate electrode, and thus is not applicable to a semiconductor device with a gate electrode having a different configuration such as an upwardly tapered gate electrode or a gate electrode having a rectangular section. On the other hand, in JP 2002-289841, the offset spacers must be formed so as to comply with respective configurations of the gate electrodes because the offset spacers are formed by oxidation after a patterning process for forming the gate electrodes. This may possibly cause non-uniformity in characteristics among transistors within one wafer surface.

SUMMARY OF THE INVENTION

It is an object of the present invention to provide a semiconductor device which utilizes an offset spacer, thereby to make respective effective gate lengths of gate electrodes uniform in spite of variety in configuration among the gate electrodes including a gate electrode having a rectangular section, an upwardly tapered gate electrode and a downwardly tapered gate electrode, and a method of manufacturing such a semiconductor device.

According to one aspect of the present invention, a semiconductor device includes a plurality of gate electrode structures formed on a semiconductor substrate. Each of the plurality of gate electrode structures includes a gate insulating film, a gate electrode and an offset spacer. The gate insulating film is formed on the semiconductor substrate. The gate electrode is formed on the gate insulating film. The offset spacer is formed on a side face of the gate electrode. Respective lengths in the plurality of gate electrode structures are substantially uniform with one another. Each of the respective lengths is defined as a sum of a gate length of the gate electrode extending on an interface between the gate insulating film and the gate electrode, and a width of the offset spacer extending on an interface between the offset spacer and the semiconductor substrate.

In the semiconductor device, respective effective gate lengths are substantially uniform in spite of variation in configuration among the gate electrodes. This provides for suppression of variation in electrical characteristics among transistors, and prevents yield of the semiconductor device from being reduced due to low performance.

According to a second aspect of the present invention, a method of manufacturing a semiconductor device includes the steps (a) to (f). The step (a) is to form gate electrodes on a semiconductor substrate, each with a gate insulating film interposed therebetween. The step (b) is to form an insulating film on the gate electrodes by CVD. The step (c) is to implant an impurity into an entire surface of the insulating film. The step (d) is to carry out wet etching on the insulating film having the impurity implanted thereinto. The step (e) is to carry out anisotropic dry etching on the insulating film provided after the step (d), to form an offset spacer. The step (f) is to measure a gate length of each of the gate electrodes after the step (a). The steps (b), (d) and (e) are modified based on a result of measurement provided by the step (f).

The method of manufacturing a semiconductor device allows the insulating film to be modified in order to achieve a desired width of the offset spacer.

These and other objects, features, aspects and advantages of the present invention will become more apparent from the following detailed description of the present invention when taken in conjunction with the accompanying drawings.

DESCRIPTION OF THE PREFERRED EMBODIMENTS

Below, the present invention will be described in detail with reference to accompanying drawings which illustrate preferred embodiments.

First Preferred Embodiment

Figure 1A:
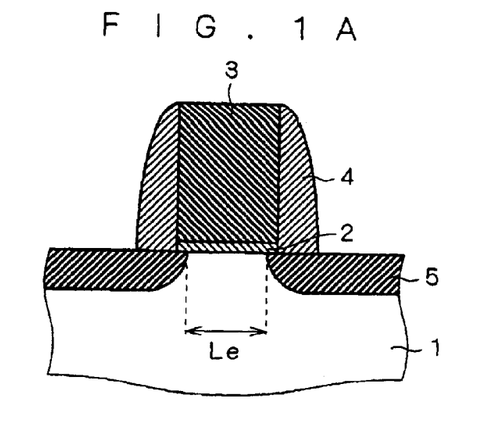
FIGS. 1 through 5 are sectional views of a semiconductor device according to a first preferred embodiment of the present invention.
Figure 1B:
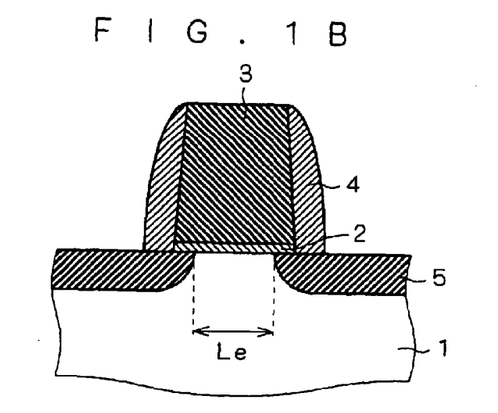
Figure 1C:
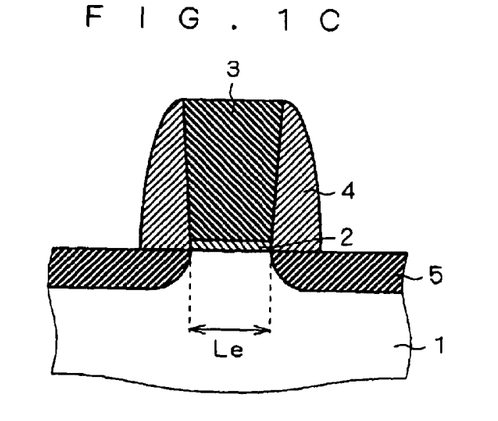

FIGS. 1A, 1B and 1C are sectional views of a semiconductor device in part according to a first preferred embodiment, which includes a plurality of gate electrode structures. In each of the gate electrode structures, a gate insulating film 2 is formed on a semiconductor substrate 1 and a gate electrode 3 is formed on the gate insulating film 2 as illustrated in FIGS. 1A, 1B and 1C. Further, a pair of offset spacers 4 ("offset spacer pair") are respectively formed on opposite side faces of each of the gate insulating film 2 and the gate electrode 3. Moreover, diffusion layers 5 are formed in the semiconductor substrate 1 so as to be located on opposite sides of a portion of the semiconductor substrate 1 immediately under the gate electrode 3, by ion implantation. FIG. 1A illustrates a case where the gate electrode 3 is configured to have a rectangular section, FIG. 1B illustrates a case where the gate electrode 3 is configured to be upwardly tapered, and FIG. 1C illustrates a case where the gate electrode 3 is configured to be downwardly tapered.

There are three general types of configurations that can be employed for the gate electrodes 3 as illustrated in FIGS. 1A, 1B and 1C. A configuration of each of the gate electrodes 3 is governed by a density of gate electrodes of a corresponding portion in a pattern, etching conditions and the like. In the case where the gate electrode 3 is configured to have a rectangular section, a gate length on a bottom surface of the gate electrode 3, which extends on an interface between the gate electrode 3 and the gate insulating film 2 (hereinafter also referred to as a "gate length Lb") is identical to a gate length on a top surface of the gate electrode 3 (hereinafter also referred to as a "gate length Lt"). In the case where the gate electrode 3 is configured to be upwardly tapered, the gate length Lb is greater than the gate length Lt. Further, in the case where the gate electrode 3 is downwardly tapered, the gate length Lb is smaller than the gate length Lt. It is additionally noted that the gate electrode 3 has the same gate length Lt in each of the cases illustrated in FIGS. 1A, 1B and 1C.

Figure 2A:
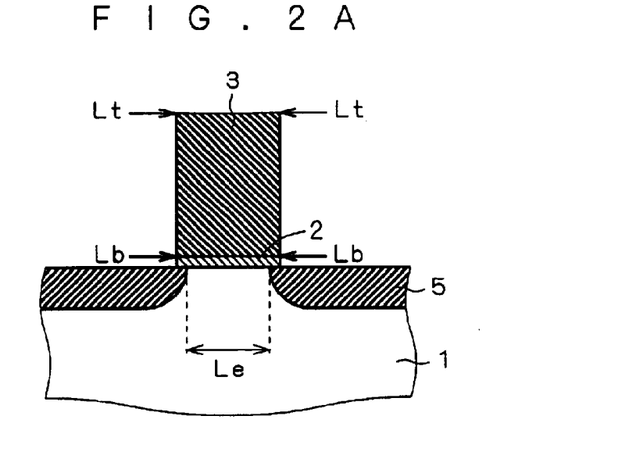
Figure 2B:
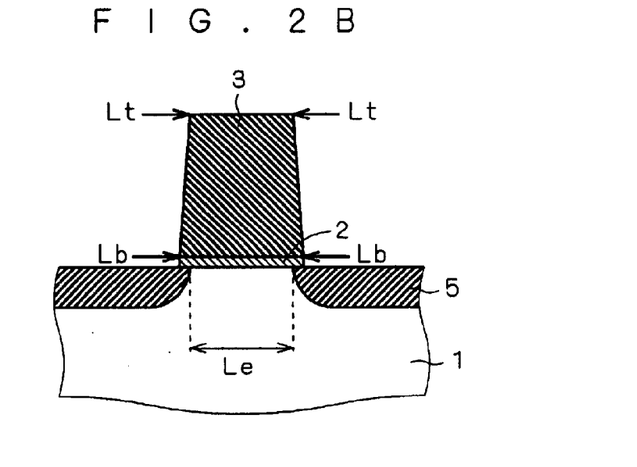
Figure 2C:
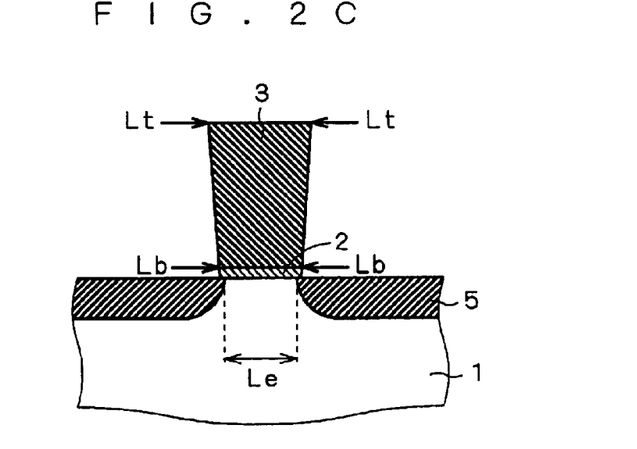

Respective configurations of the gate electrodes 3 which may vary as noted above would affect formation of the diffusion layers 5. More specifically, configurations of the diffusion layers 5 vary according to the respective gate lengths Lb of the gate electrodes 3 because the diffusion layers 5 are formed in the semiconductor substrate 1 by carrying out ion implantation using the gate electrodes 3 as a mask. It is additionally noted that a method in which the gate electrodes 3 are utilized as a mask is called self-alignment. Each of FIGS. 2A, 2B and 2C is a sectional view of the semiconductor device in part during one stage of manufacture thereof where ion implantation has been carried out using one of the gate electrodes 3 as a mask. As the gate length Lb of the gate electrode 3 increases, an effective gate length defined by the diffusion layers 5 (hereinafter also referred to as an "effective gate length Le") increases. Also, as the gate length Lb of the gate electrode 3 decreases, the effective gate length Le decreases. Accordingly, even though each of the gate electrodes 3 is formed to have the gate length Lt exactly as designed, each of the gate electrodes 3 should have the effective gate length Le which is defined by the diffusion layers 5 and is different from its design value, except the gate electrode 3 which is configured to have a rectangular section as illustrated in FIG. 2A.

More specifically, in the case where the gate electrode 3 is configured to be upwardly tapered, the effective gate length Le is greater than its design value, as illustrated in FIG. 2B. On the other hand, in the case where the gate electrode 3 is configured to be downwardly tapered, the effective gate length Le is smaller than its design value, as illustrated in FIG. 2C. Discrepancy between an actual value and a design value of the effective gate length Le results in discrepancy between electrical characteristics actually acquired and desired electrical characteristics of a transistor. This in turn causes yield of the semiconductor device to be reduced due to low performance.

In view of the foregoing, according to the first preferred embodiment, the offset spacers 4 are respectively formed on opposite side faces of each of the gate insulating film 2 and the gate electrodes 3, to control the effective gate length Le of each of the gate electrodes 3 so as to be identical to its design value. Accordingly, the mask used in the ion implantation for forming the diffusion layers 5 is composed of the gate electrodes 3 and the offset spacers 4. Thus, even if each of the gate electrodes 3 is not configured to have a rectangular section, in other words, even if each of the gate electrodes 3 is configured to be upwardly or downwardly tapered, it is possible to control the effective gate length Le so as to be identical to its design value by including the offset spacers 4.

Figure 3A:
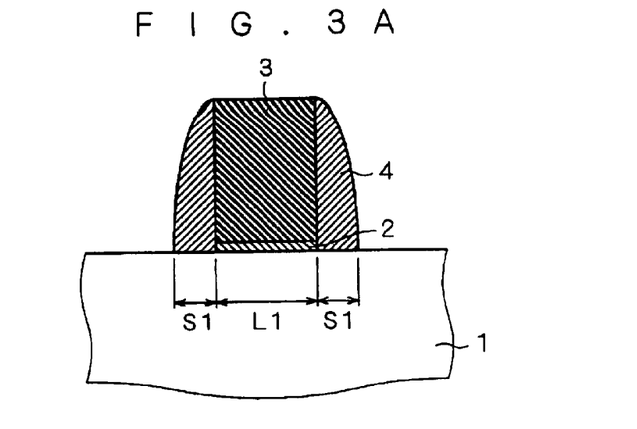
Figure 3B:
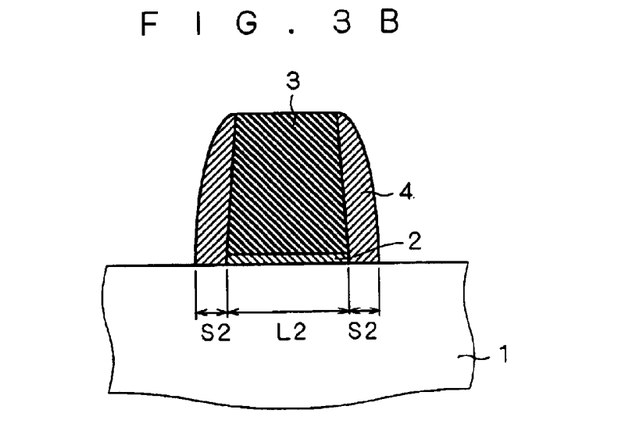
Figure 3C:
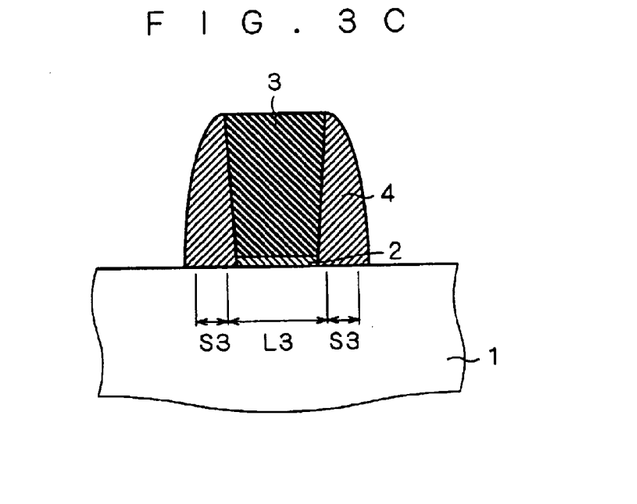

Now, assume that the gate length Lb and a width S of each of the offset spacers (offset spacer pair) 4 (the width S extends on an interface between the semiconductor substrate 1 and each of the offset spacers 4) of one of the gate electrodes 3 which is configured to have a rectangular section, are L1 and S1, respectively, as illustrated in FIG. 3A, for example. Then, in the case where one of the gate electrodes 3 is configured to be upwardly tapered, the gate length Lb of the gate electrode 3 is L2 which is greater than L1 (L2>L1), as illustrated in FIG. 3B. In this case, the width S of each of the offset spacers (offset spacer pair) 4 is adjusted to be S2 smaller than S1. On the other hand, in the case where one of the gate electrodes 3 is configured to be downwardly tapered, the gate length Lb of the gate electrode 3 is L3 which is smaller than L1 (L3<L1), as illustrated in FIG. 3C. In this case, the width S of each of the offset spacers (offset spacer pair) 4 is adjusted to be S3 greater than S1.

As described above, according to the first preferred embodiment, a configuration of each of the offset spacers 4 is varied according to a configuration of each of the gate electrodes 3 so that sums each obtained by adding the gate length Lb of the gate electrode 3 to the width of the offset spacer pair 4 can be uniform with one another. In other words, the offset spacers 4 are formed while being controlled so as to make sums each represented by "Lb+(S×2)" uniform with one another. As a result, it is possible to manufacture the semiconductor device in which the effective gate length Le of each of the gate electrodes 3 is identical to its design value irrespective of a configuration of the gate electrode 3 as illustrated in FIGS. 1A, 1B and 1C. This provides for suppression of discrepancy between electrical characteristics actually acquired and desired electrical characteristics of a transistor, and prevents yield of the semiconductor device from being reduced due to low performance.

Figure 4A:
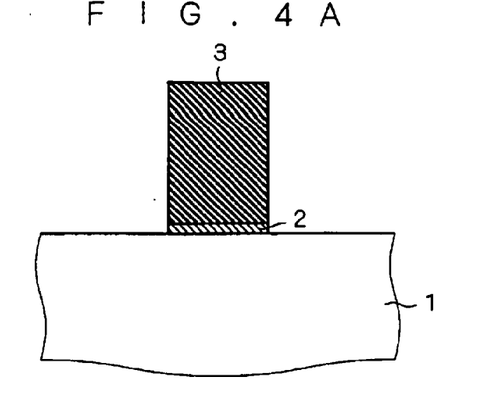
Figure 4B:
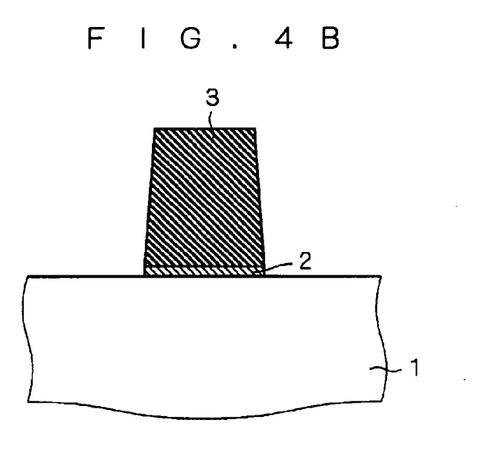
Figure 4C:
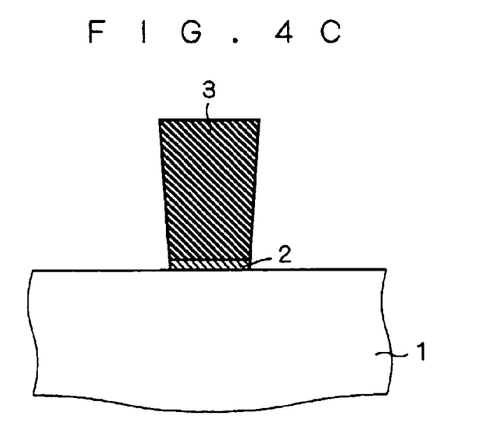
Figure 5A:
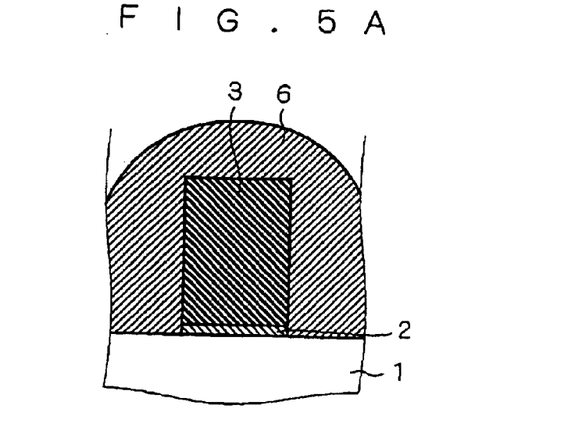
Figure 5B:
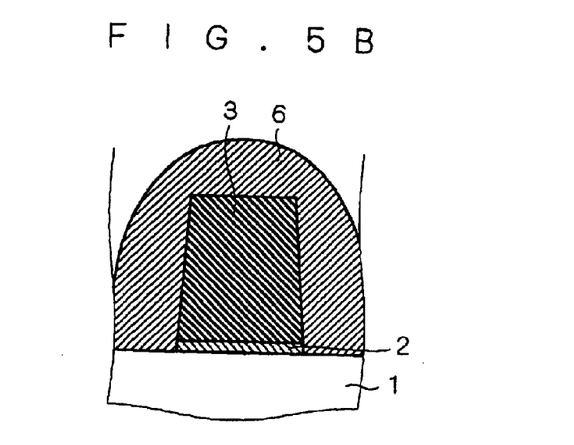
Figure 5C:
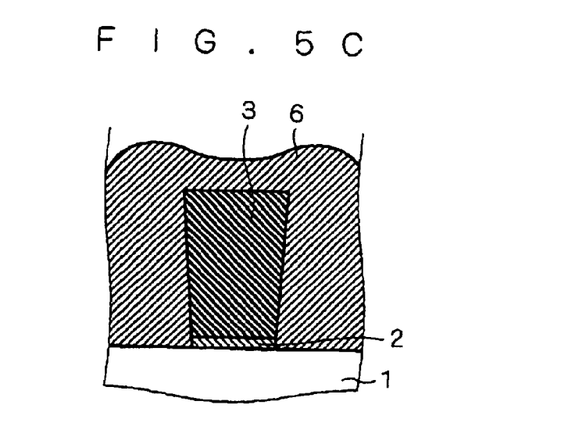

Next, a method of manufacturing a semiconductor device according to the first preferred embodiment will be described. First, as illustrated in FIGS. 4A, 4B and 4C, the gate electrodes 3 are formed on the semiconductor substrate 1, each with the gate insulating film 2 interposed therebetween, by photolithography. FIG. 4A illustrates a case where one of the gate electrodes 3 is configured to have a rectangular section, FIG. 4B illustrates a case where one of the gate electrodes 3 is configured to be upwardly tapered, and FIG. 4C illustrates a case where one of the gate electrodes 3 is configured to be downwardly tapered. Then, an insulating film 6 made of oxide which employs TEOS (tetraethyl orthosilicate: $Si(C_2H_5O)_4$)) as a raw material (TEOS oxide), or nitride, is formed on the gate electrodes 3 illustrated in FIGS. 4A, 4B and 4C, by CVD (Chemical Vapor Deposition). FIGS. 5A, 5B and 5C are sectional views of the semiconductor device in part during one stage of manufacture where the insulating film 6 has been formed. In forming the insulating film 6, it is required to control conditions under which the insulating film 6 is being formed such as a pressure, a gas flow rate and a temperature employed in the CVD, because coverage and a thickness of the insulating film 6 affect configurations of the offset spacers 4. For example, in the case where one of the gate electrodes 3 is configured to be downwardly tapered, it is required to control conditions under which the insulating film 6 is being formed, such that humps can be formed around shoulder portions of the gate electrode 3 in the insulating film 6 in order to obtain optimal coverage, as illustrated in FIG. 5C.

Subsequently, anisotropic dry etching is carried out on the insulating film 6, to form the offset spacers 4. The offset spacers 4 are configured as illustrated in FIGS. 1A, 1B and 1C. That is, the offset spacers 4 are configured so as to make sums each obtained by adding the gate lengths Lb of the gate electrode 3 to a width of the offset spacer pair 4 uniform with one another in spite of variation in configuration among the gate electrodes 3. It is noted that techniques for forming the insulating film 6 and the offset spacers 4 are not limited to CVD and anisotropic dry etching described above, respectively, in the present invention. Alternatively, an oxide film can be formed as the insulating film 6 by high density plasma (HDP) deposition, and the offset spacers 4 can be formed by carrying out sputter etching to adjust a configuration of the oxide film formed as the insulating film 6 which provides much ease in optimally configuring the offset spacers 4, for example.

Alternatively, when coverage or a thickness of the insulating film 6 which has been formed by CVD is found unsuitable, adjustment can be made to allow the insulating film 6 to have optimal coverage or thickness by the following processes. Specifically, after the insulating film 6 is formed by CVD, impurities such as arsenic are implanted into an entire surface of the insulating film 6. Next, wet etching is carried out on the insulating film 6 using a dilution of hydrofluoric acid (HF) or the like as an etchant. This wet etching is carried out at a high etch rate because the impurities such as arsenic have been implanted into the entire surface of the insulating film 6. Hence, the insulating film 6 is not isotropically etched by the wet etching at this time. As a result, it is possible to adjust coverage or thickness of the insulating film 6 to be optimal. Then, the offset spacers 4 are formed by anisotropic dry etching on the insulating film 6 on which appropriate adjustments have been performed.

As described above, the semiconductor device according to the first preferred embodiment includes a plurality of gate electrode structures formed on the semiconductor substrate 1. Each of the gate electrode structures includes the gate insulating film 2 formed on the semiconductor substrate 1, the gate electrode 3 formed on the gate insulating film 2 and the offset spacers (offset spacer pair) 4 respectively formed on opposite side faces of the gate electrode 3. Respective lengths in the plurality of gate electrode structures, each obtained by adding the gate length Lb of the gate electrode 3, which gate lengths extends on an interface between the gate insulating film 2 and the gate electrode 3, to the width of the offset spacer pair 4, which width extends on an interface between the offset spacer pair 4 and the semiconductor substrate 1, are substantially uniform with one another. Thus, the plurality of gate electrode structures have the substantially same effective gate length in spite of variation in configuration among the gate electrodes 3 therein. This provides for suppression of variation in electrical characteristics among transistors, as well as prevents yield of the semiconductor device from being reduced due to low performance.

Further, in the semiconductor device according to the first preferred embodiment, a gate electrode configured to have a rectangular section, a gate electrode configured to be upwardly tapered and a gate electrode configured to be downwardly tapered, each as the gate electrode 3, are provided on the single semiconductor substrate 1. In spite of such a situation where gate electrodes having various configurations are provided on the single semiconductor substrate 1, the gate electrodes have the substantially same effective gate length Le. This provides for suppression of variation in electrical characteristics among transistors, as well as prevents yield of the semiconductor device from being reduced due to low performance.

Moreover, inclusion of the offset spacers 4 respectively on opposite side faces of each of the gate electrodes 3 produces a further effect in addition to an effect of making the respective effective gate lengths Le substantially uniform. Specifically, inclusion of the offset spacers 4 can prevent ions implanted at an oblique angle in the ion implantation for forming the diffusion layers 5 from penetrating into the gate electrode 3 via a boundary, depending on a direction of grain. This additional effect also contributes to suppression of variation in electrical characteristics among transistors. Furthermore, inclusion of the offset spacers 4 can reduce a gate overlap capacitance or short channel effect.

The method of manufacturing a semiconductor device according to the first preferred embodiment includes: a step of forming the gate electrodes 3 on the semiconductor substrate 1, each with the gate insulating film 2 interposed therebetween; a step (a) of forming the insulating film 6 on the gate electrodes 3 by CVD; a step (b) of implanting an impurity into an entire surface of the insulating film 6; a step (c) of carrying out wet etching on the insulating film 6 into which the impurity has been implanted; and a step (d) of forming the offset spacers 4 by carrying out anisotropic dry etching on the insulating film 6 on which the wet etching has been carried out. Further, a step of measuring a gate length of each of the gate electrodes 3 after formation of the gate electrodes 3 is included, and the steps (a), (c) and (d) are modified based on the gate length as measured. This makes it possible to control the insulating film 6 such that the offset spacers 4 can have respective predetermined widths each as the width S.

Furthermore, a configuration of each of the gate electrodes 3 depends on not only a density of gate electrodes of a corresponding portion in a pattern, but also whether the gate electrode 3 is used in an NMOS device or a PMOS device assuming that the gate electrode 3 is used in a MOS device. As a kind of impurities to be doped in an NMOS device is different from that in a PMOS device, there is caused a difference in configuration between each of the gate electrodes 3 formed in the NMOS device and each of the gate electrodes 3 formed in the PMOS device during an etching process for forming the gate electrodes 3. In spite of such difference in configuration among gate electrodes caused due to difference in device type (i.e., difference in kind of doped impurities), it is possible to keep the respective effective gate lengths Le uniform in a self-aligned manner by making sums each obtained by adding the gate length Lb of the gate electrode 3 to the width of the offset spacer pair 4 uniform with one another.

Second Preferred Embodiment

Figure 6:
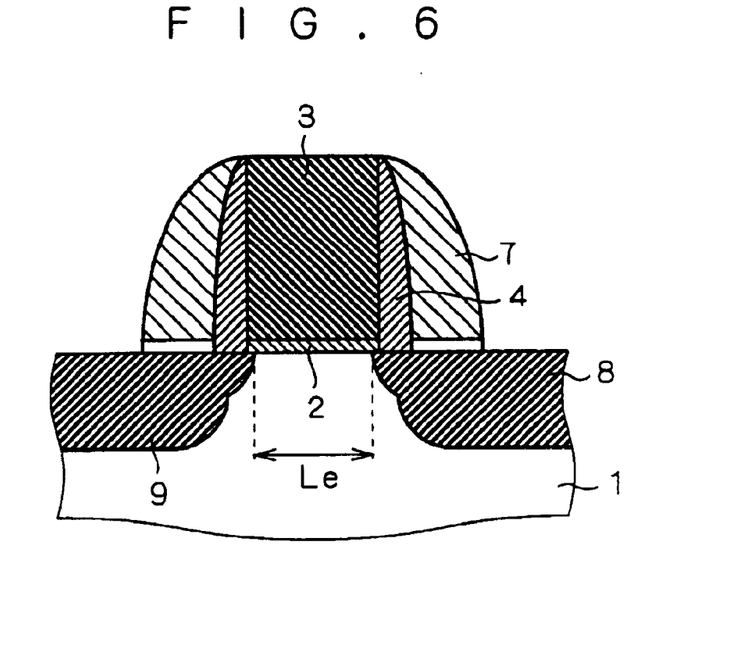
FIG. 6 is a sectional view of a semiconductor device according to a second preferred embodiment of the present invention.

FIG. 6 is a sectional view of a semiconductor device in part according to a second preferred embodiment, which includes a plurality of gate electrode structures. In each of the gate electrode structures, the gate insulating film 2 is formed on the semiconductor substrate 1 and the gate electrode 3 is formed on the gate insulating film 2 as illustrated in FIG. 6. Also, a pair of the offset spacers (offset spacer pair) 4 are respectively formed on opposite side faces of each of the gate insulating film 2 and the gate electrode 3. Further, a sidewall 7 is formed on an outer side face of each of the offset spacers 4. A pair of shallow diffusion layers 8, as well as a pair of deep diffusion layers 9, are formed in the semiconductor substrate 1 so as to be located on opposite sides of a portion of the semiconductor substrate 1 immediately under the gate electrode 3. It is noted that though FIG. 6 illustrates the gate electrode 3 configured to have a rectangular section, the gate electrode 3 may alternatively be configured to be upwardly or downwardly tapered.

In manufacturing the semiconductor device according to the second preferred embodiment, the shallow diffusion layers 8 are formed by ion implantation using the gate electrode 3 and the offset spacers 4 collectively as a mask after the offset spacers 4 are formed in each of the gate electrode structures. The offset spacers 4 are controlled in order to suppress variation in effective gate length among the gate electrodes 3 in the second preferred embodiment similarly to the first preferred embodiment. Then, the sidewall 7 is formed on an outer side face of each of the offset spacers 4. The sidewall 7 can be typically formed by forming an insulating film on the gate electrodes 3 and subsequently carrying out anisotropic dry etching on the insulating film.

After the sidewalls 7 are formed, ion implantation is carried out using the gate electrode 3, the offset spacers 4 and the sidewalls 7 collectively as a mask, to form the deep diffusion layers 9 in each of the gate electrode structures. Then, annealing is carried out after the ion implantation for forming the deep diffusion layers 9, to complete the semiconductor device as illustrated in FIG. 6. The semiconductor device illustrated in FIG. 6 has a plurality of MOSFET structures each including the shallow diffusion layers (shallow source/drain regions) 8 and the deep diffusion layers (deep source/drain regions) 9, in which the respective effective gate lengths Le of the gate electrode 3 are uniform with one another in spite of variation in configuration among the gate electrodes 3, as in the semiconductor device according to the first preferred embodiment.

As described above, in the semiconductor device according to the second preferred embodiment, a pair of the shallow source/drain regions 8, as well as a pair of the deep source/drain regions 9, are formed in the semiconductor substrate 1 so as to be located on opposite sides of a portion of the semiconductor substrate 1 immediately under the gate electrode 3, to form one MOSFET structure. Also, the respective effective gate lengths Le are substantially uniform with one another in spite of variation in configuration among the gate electrodes 3. Thus, the semiconductor device according to the second preferred embodiment includes a plurality of MOSFET structures, provides for suppression of variation in electrical characteristics among transistors, and prevents yield of the semiconductor device from being reduced due to low performance.

Third Preferred Embodiment

In connection with formation of the gate electrodes 3, another undesirable situation where the gate electrodes 3 are equally displaced so that each of the gate electrodes 3 has a gate length smaller or greater than a predetermined gate length can possibly occur, in addition to the above described situation where gate electrodes varying in configuration such as a gate electrode having a rectangular section, an upwardly tapered gate electrode and a downwardly tapered gate electrode are provided. A third preferred embodiment provides for such a situation where gate electrodes are equally displaced so that each of the gate electrodes has a gate length different from a predetermined gate length. Below, description will be made about methods of manufacturing a semiconductor device according to the third preferred embodiment, in which respective effective gate lengths Le are adjusted to be substantially uniform with one another in a "feedforward" manner. It is noted that the methods of manufacturing a semiconductor device according to the third preferred embodiment can be combined with the method of manufacturing the semiconductor device according to the first preferred embodiment.

Figure 7:
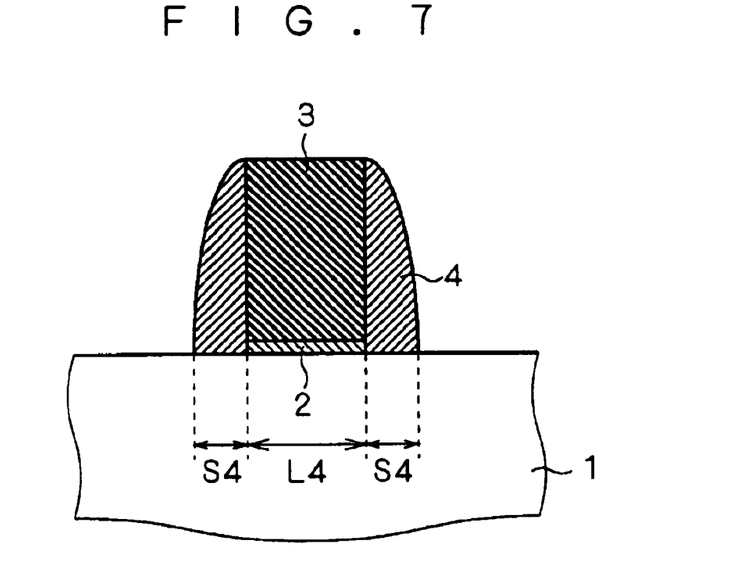
FIGS. 7 and 8 are sectional views of a semiconductor device according to a third preferred embodiment of the present invention.
Figure 8:
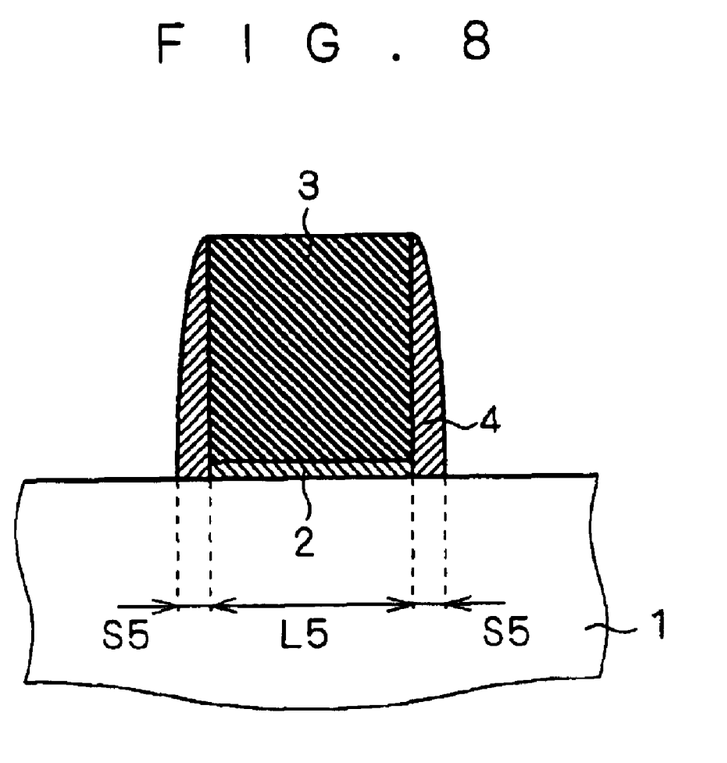

Each of FIGS. 7 and 8 illustrates the gate electrode 3 which is configured to have a rectangular section. FIG. 7 illustrates a case where the gate electrode 3 is formed so as to have a gate length L4 smaller than a predetermined gate length. On the other hand, FIG. 8 illustrates a case where the gate electrode 3 is formed so as to have a gate length L5 greater than the predetermined gate length. It is noted that though each of FIGS. 7 and 8 illustrates the gate electrode 3 configured to have a rectangular section, the methods described below are applicable also to a case where the gate electrode 3 is configured to be upwardly or downwardly tapered.

Take the gate electrode 3 as illustrated in FIG. 7 as an example, according to one of the methods of the third preferred embodiment, the gate length L4 is measured, first. Then, formation of the offset spacers 4 to be subsequently performed is modified based on a result of the measurement. More specifically, as a result of measurement of the gate length L4 of the gate electrode 3 illustrated in FIG. 7, it is determined that the gate length L4 is smaller than the predetermined gate length. Hence, a width S4 of each of the offset spacers 4 must be made greater than a predetermined width. To this end, the insulating film 6 is formed over the gate electrodes 3 so as to have a thickness greater than a predetermined thickness during formation of the insulating film 6 using CVD. Thereafter, anisotropic dry etching is carried out on the insulating film 6, to form the offset spacers 4.

On the other hand, in the case illustrated in FIG. 8 where the gate electrode 3 is formed to have the gate length L5, the gate length L5 is measured and determined to be greater than the predetermined gate length. Hence, a width S5 of each of the offset spacers 4 must be made smaller than the predetermined width. To this end, the insulating film 6 is formed over the gate electrodes 3 so as to have a thickness smaller than the predetermined thickness during formation of the insulating film 6 using CVD. Thereafter, anisotropic dry etching is carried out on the insulating film 6, to form the offset spacers 4, in the same manner as noted above regarding the case illustrated in FIG. 7.

As described above, according to one of the methods of manufacturing a semiconductor device of the third preferred embodiment, when the gate electrodes 3 are equally displaced so that each of the gate electrodes 3 has a gate length smaller than a predetermined gate length, the insulating film 6 is formed over the gate electrodes 3 so as to have a thickness greater than a predetermined thickness. On the other hand, when the gate electrodes 3 are equally displaced so that each of the gate electrodes 3 has a gate length greater than the predetermined gate length, the insulating film 6 is formed over the gate electrodes 3 so as to have a thickness smaller than the predetermined thickness. As such, it is possible to form the offset spacers 4 having respective optimal configurations, taking into account respective configurations of the gate electrodes 3, thereby to make the respective effective gate lengths Le substantially uniform in a "feedforward" manner.

Next, a second method of manufacturing a semiconductor device in which formation of the offset spacers 4 is modified based on a result of measurement of a gate length will be described. Take the gate electrode 3 as illustrated in FIG. 7 as an example, the gate length L4 of the gate electrode 3 is measured and determined to be smaller than a predetermined gate length. Hence, the width S4 of each of the offset spacers 4 must be made greater than a predetermined width. To this end, wet etching is carried out on the insulating film 6, which has been formed over the gate electrodes 3 by CVD, in the same manner as described in the first preferred embodiment, but for a shorter time than a predetermined time. This results in increase of thickness of the insulating film 6 as compared to a predetermined thickness. Thereafter, anisotropic dry etching is carried out on the insulating film 6, to form the offset spacers 4.

On the other hand, in the case illustrated in FIG. 8 where the gate electrode 3 is formed to have the gate length L5, the gate length L5 is measured and determined to be greater than the predetermined gate length. Hence, the width S5 of each of the offset spacers 4 must be made smaller than the predetermined width. To this end, wet etching is carried out on the insulating film 6, which has been formed over the gate electrodes 3 by CVD, in the same manner as described in the first preferred embodiment, but for a longer time than the predetermined time. This results in decrease of thickness of the insulating film 6 as compared to the predetermined thickness. Thereafter, anisotropic dry etching is carried out on the insulating film 6, to form the offset spacers 4, in the same manner as noted above regarding the case illustrated in FIG. 7.

According to the second method of manufacturing a semiconductor device of the third preferred embodiment, when the gate electrodes 3 are equally displaced so that each of the gate electrodes 3 has a gate length smaller than a predetermined gate length, wet etching is carried out on the insulating film 6 for a shorter time than a predetermined time. On the other hand, when the gate electrodes 3 are equally displaced so that each of the gate electrodes 3 has a gate length greater than the predetermined gate length, wet etching is carried out on the insulating film 6 for a longer time than the predetermined time. As a result, it is possible to make the respective effective gate lengths Le substantially uniform in a "feedforward" manner. As an alternative approach for adjusting the thickness of the insulating film 6, the thickness of the insulating film 6 may be adjusted by adjusting a concentration of an etchant such as a dilution of hydrofluoric acid (HF) used in the wet etching.

Further, a third method of manufacturing a semiconductor device in which formation of the offset spacers 4 is modified based on a result of measurement of a gate length will be described. Take the gate electrode 3 as illustrated in FIG. 8 as an example, the gate electrode 3 is formed to have the gate length L5 and the gate length L5 is measured and determined to be greater than a predetermined gate length. Hence, the width S5 of each of the offset spacers 4 must be made smaller than a predetermine width. To this end, anisotropic dry etching to be carried out on the insulating film 6 formed over the gate electrodes 3 is modified such that the insulating film 6 is over etched. This allows each of the offset spacers 4 to be formed so as to have the width S5 smaller than the predetermined width.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising;

a plurality of gate electrode structures formed on a semiconductor substrate, each of which comprises:

a gate insulating film formed on said semiconductor substrate;

a gate electrode formed on said gate insulating film; and an offset spacer formed on a side face of said gate electrode;

wherein respective lengths of said plurality of gate electrode structures are substantially uniform with one another, each of said lengths being defined as a sum of a gate length extending on an interface between said gate insulating film and said gate electrodes, and a width of said offset spacer extending on an interface between said offset spacer and said semiconductor substrate, and said plurality of gate electrode structures include a first gate electrode having a rectangular section, a second gate electrode having a upwardly tapered section, and a third gate electrode having a downwardly tapered section.

2. The semiconductor device according to claim 1, wherein a pair of shallow source/drain regions and a pair of deep source/drain regions are formed to form a MOSFET, said regions in each of said pairs being formed in said semiconductor substrate on opposite sides of a portion of said semiconductor substrate immediately under said gate electrode.

* * * * *